United States Patent
Tada

[19]

[11] Patent Number: 6,104,636

[45] Date of Patent: Aug. 15, 2000

[54] SEMICONDUCTOR MEMORY WHICH CAN STORE TWO OR MORE BITS OF DATA IN EACH MEMORY CELL

[75] Inventor: Yoshihiro Tada, Kyoto, Japan

[73] Assignee: Rohm Co., Ltd., Kyoto, Japan

[21] Appl. No.: 09/114,964

[22] Filed: Jul. 14, 1998

[30] Foreign Application Priority Data

Jul. 14, 1997 [JP] Japan .................................. 9-187929

[51] Int. Cl.[7] .................................................. G11C 16/04
[52] U.S. Cl. .............................. 365/185.24; 365/185.03; 365/185.05; 365/185.11
[58] Field of Search ........................ 365/185.18, 185.03, 365/185.05, 185.11, 185.24

[56] References Cited

U.S. PATENT DOCUMENTS

| | | | |
|---|---|---|---|
| 5,289,401 | 2/1994 | Shima | 365/45 |
| 5,694,357 | 12/1997 | Mori | 365/185.03 |
| 5,781,489 | 7/1998 | Okamoto | 365/208 |
| 5,847,597 | 12/1998 | Ooishi et al. | 327/543 |
| 5,870,218 | 2/1999 | Jyoumo et al. | 365/185.03 |
| 5,892,714 | 4/1999 | Choi | 365/185.22 |
| 5,901,089 | 5/1999 | Korsh et al. | 365/185.24 |

*Primary Examiner*—Richard Elms
*Assistant Examiner*—Hien Nguyen
*Attorney, Agent, or Firm*—Arent Fox Kintner Plotkin & Kahn

[57] ABSTRACT

In a semiconductor memory in which each memory cell is composed of a transistor having a floating gate between a control gate and a conducting channel formed between a drain and a source and in which storage of data is achieved on the principle that the threshold voltage of the transistor varies with the amount of electric charge accumulated in the floating gate, while a transistor constituting a memory cell from which data is read out is supplied with a predetermined current, the control gate and the drain of that transistor are kept short-circuited.

9 Claims, 6 Drawing Sheets

| VOLTAGE ON BIT LINE | OUTPUT OF SENSE AMPLIFIER SA-1 | OUTPUT OF SENSE AMPLIFIER SA-2 | OUTPUT OF SENSE AMPLIFIER SA-3 |
|---|---|---|---|
| $V_{BL1}$ | 0 | 0 | 0 |
| $V_{BL2}$ | 1 | 0 | 0 |
| $V_{BL3}$ | 1 | 1 | 0 |
| $V_{BL4}$ | 1 | 1 | 1 |

SEMICONDUCTOR MEMORY WHICH CAN STORE TWO OR MORE BITS OF DATA IN EACH MEMORY CELL

BACKGROUND OF THE INVENTION

1. Field of the Invention

The present invention relates to a semiconductor memory, and particularly to a semiconductor memory that can store two or more bits of data in each of its memory cells.

2. Description of the Prior Art

Figure 5A:
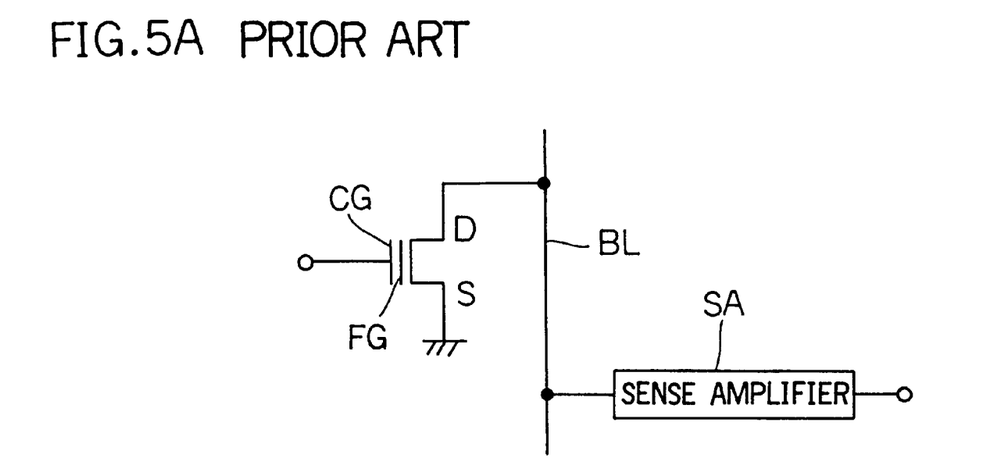
FIG. 5A is a diagram illustrating the interconnection between the transistor constituting a memory cell and the sense amplifier.
Figure 5B:
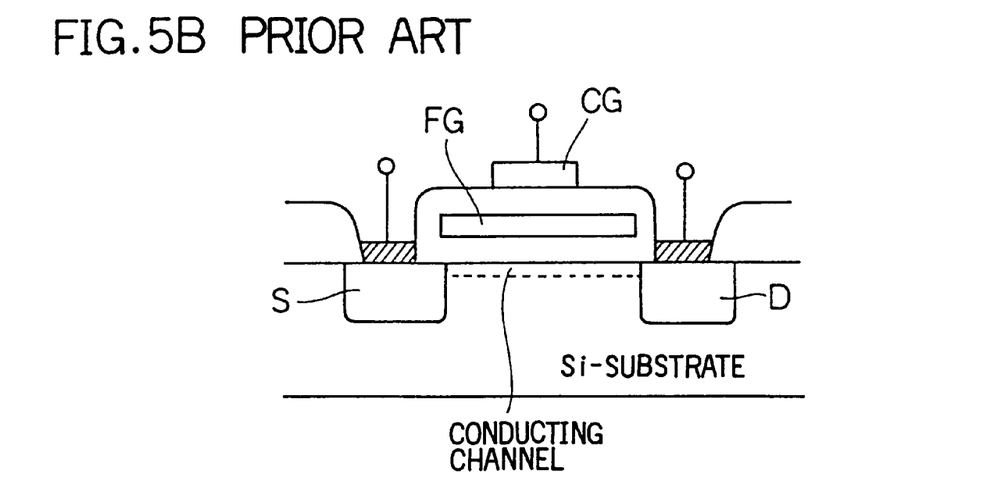
FIG. 5B is a diagram illustrating the structure of the transistor that constitutes a memory cell.

A conventional semiconductor memory, for example a flash memory, is constructed and operates as follows. As shown in FIG. 5B, in a flash memory, each of its memory cells is composed of a MOS-type FET (hereafter simply referred to as a transistor) having a floating gate FG (a gate insulated from the surroundings) between a control gate CG and a conducting channel formed between a drain D and a source S within a silicon substrate. To store data, a flash memory exploits the fact that the threshold voltage of this transistor with respect to the control gate varies with the amount of electric charge accumulated in the floating gate. As shown in FIG. 5A, each memory cell is connected to a sense amplifier SA by way of a bit line BL, so that, by detecting the voltage appearing on the bit line BL with the sense amplifier SA, data is read out.

Figure 6:
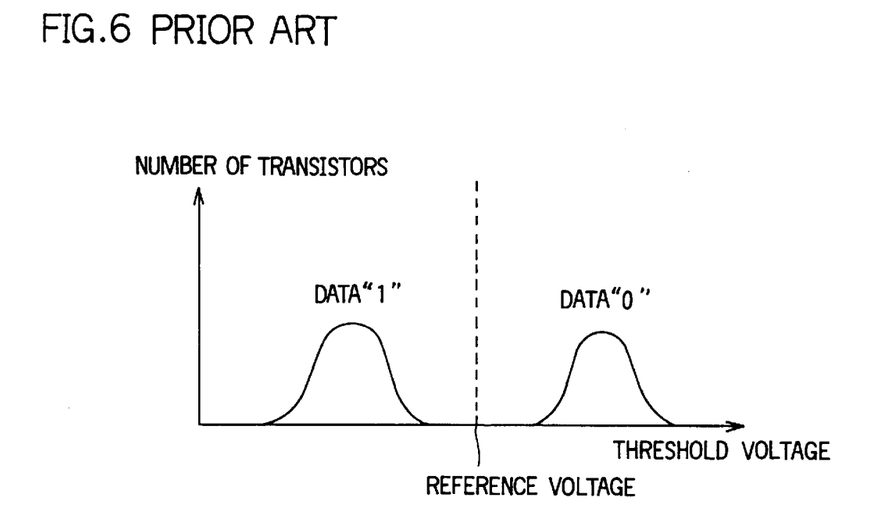
FIG. 6 is a diagram illustrating the distribution of the threshold voltage in a memory array composed of one-bit-per-cell memory cell transistors.

In general, the amount of electric charge accumulated in the floating gate of the transistor is so controlled that, as shown in FIG. 6, the threshold voltage of the transistor falls within one of two states. This makes it possible to store one-bit data, i.e. "0" or "1". That is, one bit of data is stored in each memory cell.

In this case, when a reference voltage, i.e. a voltage approximately in the middle between the two states of the threshold voltage, is applied to the control gate CG of the transistor, if the threshold voltage of the transistor is lower than the reference voltage, meaning that the memory cell is holding "1", the transistor is turned on, and, if the threshold voltage of the transistor is higher than the reference voltage, meaning that the memory cell is holding "0", the transistor is turned off.

While the reference voltage is being applied to the control gate CG, if a constant voltage is applied to or a constant current is supplied to the bit line BL that is connected to the drain D of the transistor, the bit line BL, when the memory cell is holding "1", drops to a low level and, when the memory cell is holding "0", rises to a high level. Thus, the voltage on the bit line varies in accordance with the data stored in the memory cell.

By judging whether the voltage thus appearing on the bit line BL is higher or lower than a predetermined voltage by the use of the sense amplifier SA, data is read out. Specifically, a voltage on the bit line higher than the predetermined voltage represents "0", and a voltage lower than it represents "1".

Figure 7:
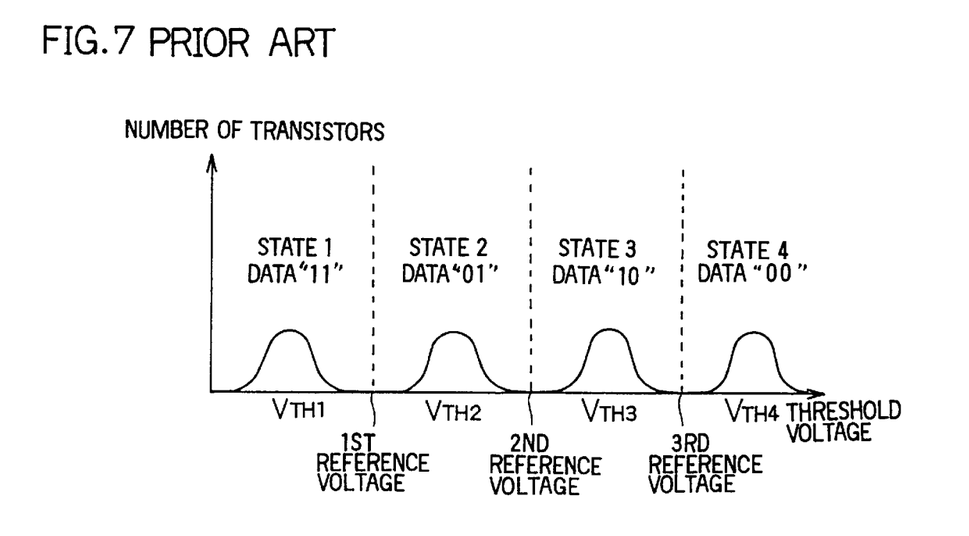
FIG. 7 is a diagram illustrating the distribution of the threshold voltage in a memory array composed of two-bits-per-cell memory cell transistors.

In recent years, remarkable progress has been made in the techniques for so-called multivalued storage in which two or more bits of data are stored in one memory cell. For example, in four-valued storage, that is, in cases where two bits of data are stored in one memory cell, the amount of electric charge accumulated in the floating gate of the transistor is so controlled that, as shown in FIG. 7, the threshold voltage of the transistor falls within one of four states. This makes it possible to store two-bit data "00", "01", "10", or "11".

To read out data from such a two-bits-per-cell memory cell, it is necessary to prepare, as voltages to be applied to the control gate of the transistor, three reference voltages (hereafter referred to as the first, second, and third reference voltages, respectively) that are approximately in the middle between two adjacent ones of the above-mentioned four states of the threshold voltage.

Specifically, data is read out in the following manner. First, the second reference voltage, i.e. the middle one among the three reference voltages, is applied to the control gate CG of the transistor, and the bit line is operated in the same manner as in the above-described one-bit-per-cell case.

As a result, whether the threshold voltage of the transistor is higher or lower than the second reference voltage, that is, whether the data stored in the memory cell is one of "11" and "01" or one of "10" and "00" is determined.

Next, if the threshold voltage of the transistor has been found to be higher than the second reference voltage, the third reference voltage, i.e. the highest one among the three threshold voltages, is applied to the control gate CG of the transistor, and the bit line BL is operated in the same manner as in the above-described one-bit-per-cell case. On the other hand, if the threshold voltage of the transistor has been found to be lower than the second reference voltage, the first reference voltage, i.e. the lowest one among the three threshold voltages, is applied to the control gate CG of the transistor, and the bit line BL is operated in the same manner as in the above-described one-bit-per-cell case.

As a result, whether the threshold voltage of the transistor is higher than the third reference voltage, between the third and second reference voltages, between the second and first reference voltages, or lower than the first reference voltage, that is, whether the data stored in the memory cell is "00", "10", "01", or "11" is determined.

As described above, to read out data from a two-bits-per-cell memory cell, a read operation needs to be performed in two steps. The greater the number of bits that are stored in one memory cell, the greater the number of steps required to read out data.

Accordingly, a semiconductor memory having multivalued-storage memory cells (of which each can store two or more bits of data) suffers from long access time and high current consumption, and these inconveniences become more serious as the number of bits stored in one memory cell increases.

Moreover, conventional semiconductor memories suffer from reduced data storage accuracy resulting from drain disturbance or read disturbance. Drain disturbance denotes a change in the amount of electric charge accumulated in the floating gate caused by generation and injection of weak hot electrons or a tunnel current resulting from the drain-gate voltage. Read disturbance denotes a change in the amount of electric charge accumulated in the floating gate caused by generation and injection of weak hot electrons resulting from the current that flows through the channel when data is read out.

The change in the amount of electric charge in the floating gate occurs regardless of the number of bits stored in one memory cell. However, semiconductor memories having multivalued-storage memory cells tend to be more susceptible to reduced data storage accuracy, because they have smaller differences between threshold voltages.

SUMMARY OF THE INVENTION

An object of the present invention is, in a semiconductor memory that stores two or more bits of data in each of its memory cells, to reduce the access time required and the power consumed to read out data, and to increase the data storage accuracy.

To achieve the above object, according to the present invention, in a semiconductor memory in which each memory cell is composed of a transistor having a floating gate between a control gate and a conducting channel formed between a drain and a source and in which storage of data is achieved on the principle that the threshold voltage of the transistor varies with the amount of electric charge accumulated in the floating gate, while a transistor constituting a memory cell from which data is read out is supplied with a predetermined current, the control gate and the drain of that transistor are kept short-circuited.

In this semiconductor memory, by controlling the amount of electric charge accumulated in the floating gate, it is possible to freely set the threshold voltage of the transistor. This makes it possible to store two or more bits of data in one memory cell. The control gate-source voltage of the transistor, when its control gate and drain are short-circuited, varies with the threshold voltage of the transistor as long as the drain-source current is constant. As a result, even if two or more bits of data are stored in one memory cell, the data can be read out in one step. In addition, by keeping the control gate and the drain short-circuited, these two electrodes are kept at an equal potential, and thereby drain disturbance is prevented.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
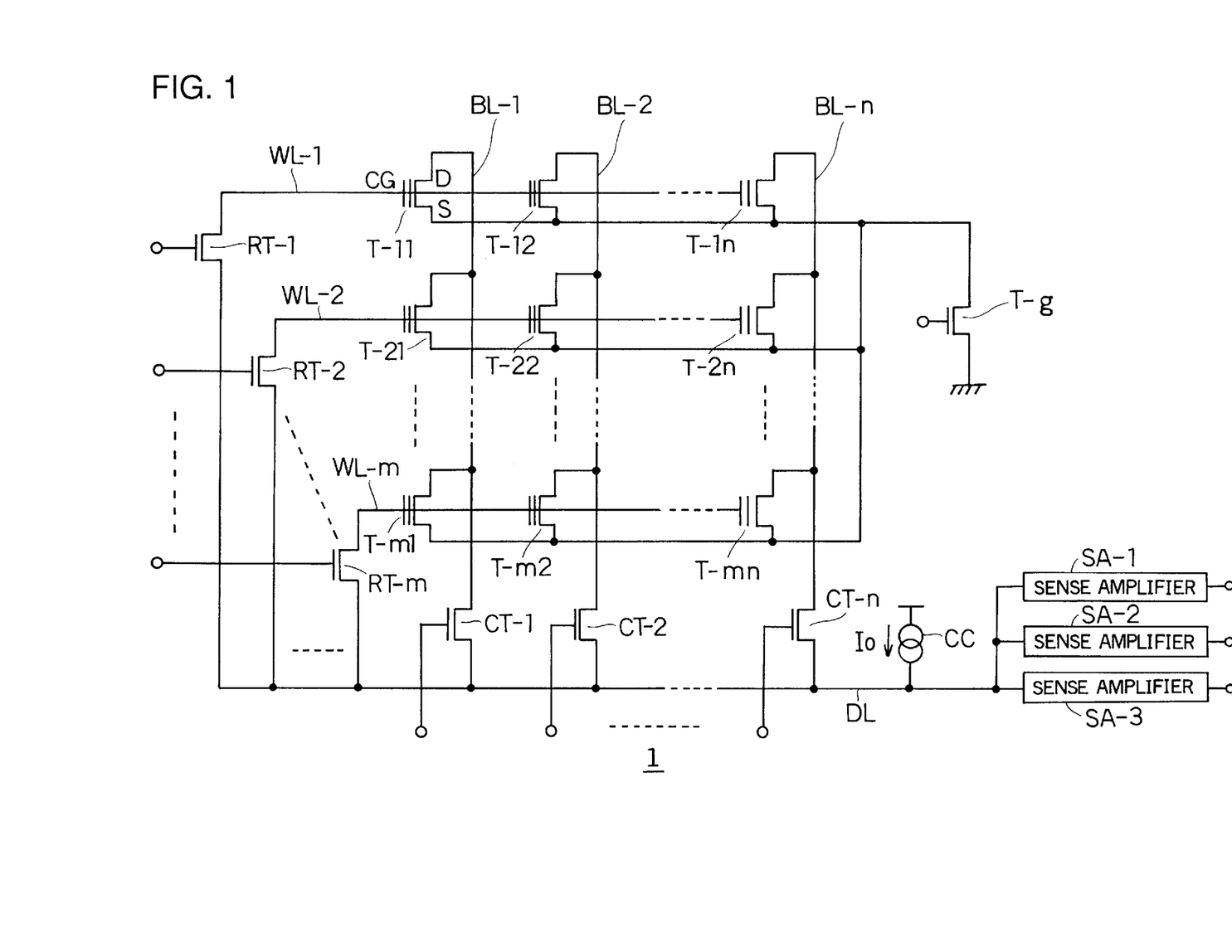
FIG. 1 is a circuit diagram of a semiconductor memory embodying the present invention.

Hereinafter, an embodiment of the present invention will be described with reference to the drawings. FIG. 1 shows a circuit diagram of a semiconductor memory 1 embodying the present invention. In FIG. 1, T-xy (x=1, 2, ..., m and y=1, 2, ..., n throughout the present specification) represents n-channel MOS-type FETs (hereafter referred to as memory cell transistors) each having a floating gate FG between a control gate CG and a conducting channel formed between a drain D and a source S, just like the one shown in FIG. 5B. The memory cell transistors T-xy are arranged in a matrix of m rows×n columns so as to form a memory cell array.

RT-x and CT-y represent n-channel MOS-type FETs that are used to select a specific row or column, respectively, of the memory array (hereafter, those labeled RT-x will be referred to as row-selecting transistors and those labeled CT-y as column-selecting transistors). WL-x represents word lines, BL-y represents bit lines, DL represents a data line, CC represents a constant-current circuit, and SA-1, SA-2, and SA-3 are sense amplifiers.

Memory cell transistors T-xy have their control gate connected to the word lines WL-x, have their drains connected to the bit lines BL-y, and have their sources connected through a transistor T-g to a ground-potential point. This transistor T-g has its gate connected to a controller (not shown) for switching between writing and reading operations so that it will be turned on when data is read out. The word lines WL-x are connected to the data line DL through the drain-source channels of the row-selecting transistors RT-x, and the bit lines BL-y are connected to the data line DL through the drain-source channels of the column-selecting transistors CT-y.

The constant-current circuit CC is connected to the data line DL to supply a predetermined current $I_0$ to the memory cell transistors T-xy. The three sense amplifiers SA-1, SA-2, and SA-3 are connected in parallel to one end of the data line DL. The gates of the row-selecting transistors RT-x and the gates of the column-selecting transistors CT-y are connected to the outputs of a row decoder and a column decoder, respectively.

The memory cell transistors T-xy are each capable of storing one of four values. This is achieved by accumulating electric charge in their floating gate FG in such a way that, as shown in FIG. 7, the threshold voltage with respect to the control gate CG falls within one of four states 1, 2, 3, and 4. In the semiconductor memory 1, these four states 1, 2, 3, and 4 are used to represent "11", "01", "10", and "00", respectively, and thereby two-bits-per-cell storage of data is achieved. In the following descriptions, it is assumed that, when the threshold voltage is in the state 1, 2, 3, or 4, it equals $V_{TH1}$, $V_{TH2}$, $V_{TH3}$, or $V_{TH4}$, respectively.

In the semiconductor memory 1 having the structure as described above, data is read out in the following manner. First, the row and column decoders apply a high-level voltage to the gate of one of a number m of row-selecting transistors and to the gate of one of a number n of column-selecting transistors, and thereby one among a number m x n of memory cell transistors T-xy is selected.

Figure 2:
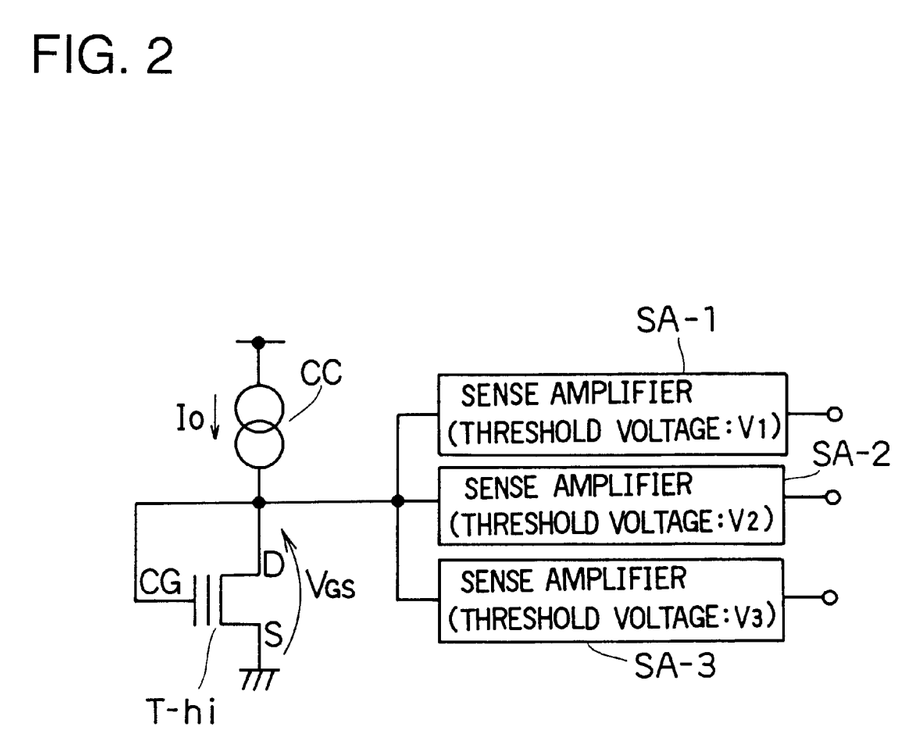
FIG. 2 is a diagram illustrating the interconnection between the selected transistor, the constant-current circuit, and the sense amplifier in the semiconductor memory of the invention.

Now, suppose that a high-level voltage is applied to the gate of the row-selecting transistor RT-h (h=1~m) and to the gate of the column-selecting transistor CT-i (i=1~n) and thereby the memory cell transistor T-hi is selected. At this time, the drain-source channel of the row-selecting transistor RT-h and the drain-source channel of the column-selecting transistor CT-i are turned on (i.e. start to conduct). As a result, as shown in FIG. 2, only in this selected transistor T-hi, the control gate CG and the drain D are short-circuited.

Here, in a MOS-type FET that has its control gate and drain short-circuited, the following relation holds:

$$I_{DS}=k(V_{GS}-V_{TH})^2,$$

where $I_{DS}$ represents the drain-source current, $V_{GS}$ represents the control gate-source voltage, $V_{TH}$ represents the threshold voltage of the transistor, and k represents a constant determined by the structure of the transistor.

Figure 3:
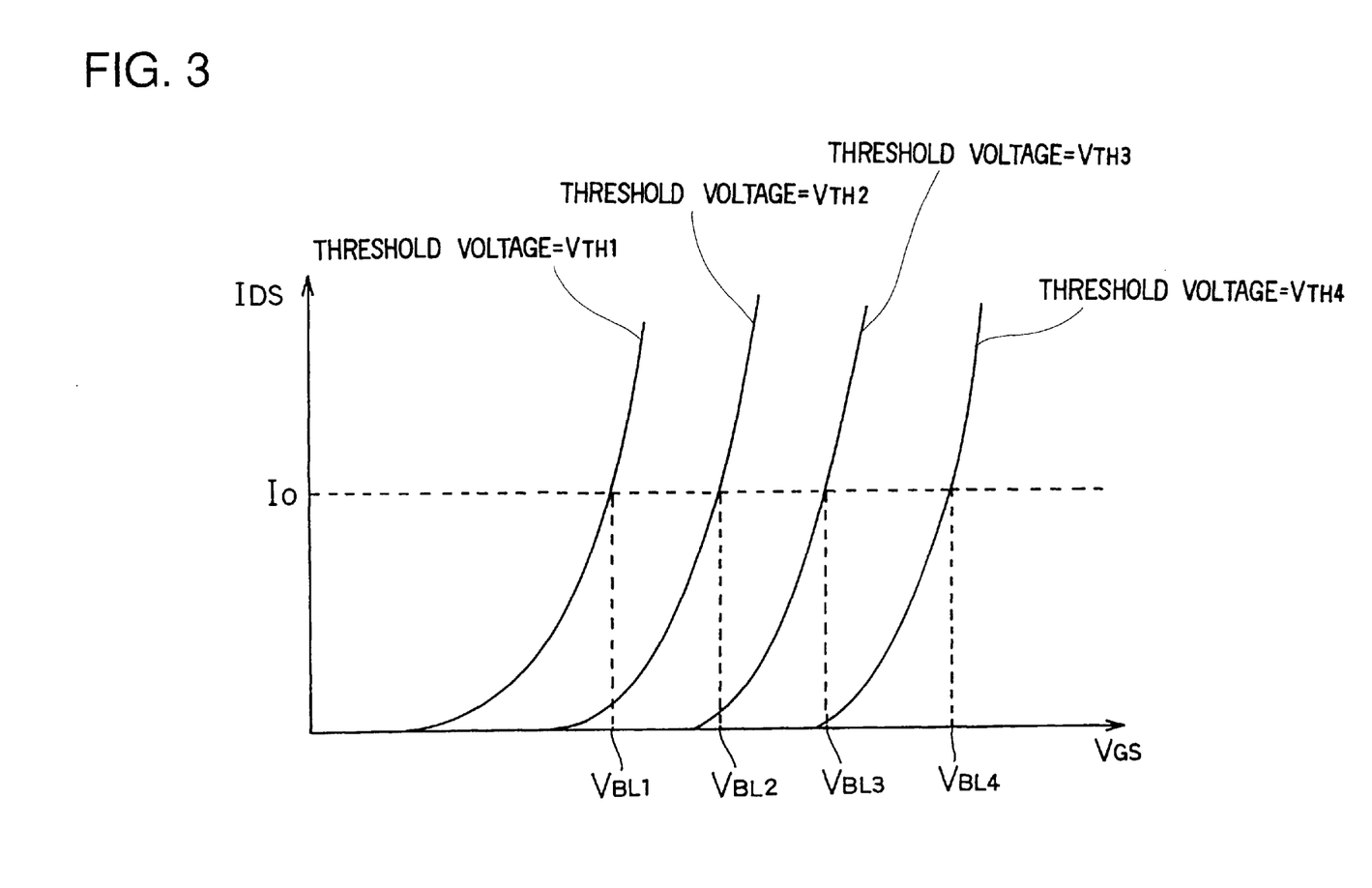
FIG. 3 is a diagram illustrating the relation between the control gate-source voltage and the drain-source current of the memory cell transistor in the semiconductor memory of the invention.

FIG. 3 shows the relation between the control gate-source (CG-S) voltage $V_{GS}$ and the drain-source (D-S) current $I_{DS}$ in the memory cell transistor T-hi. Since the memory cell transistor T-hi is supplied with a predetermined current $I_0$ by the constant-current circuit CC, the voltage on the bit line BL-i that is connected to the drain D of this transistor exhibits correspondence to the threshold voltage of the memory cell transistor T-hi. Here, it is assumed that, when the threshold voltage of the memory cell transistor T-hi equals $V_{TH1}$, $V_{TH2}$, $V_{TH3}$, or $V_{TH4}$, the voltage on the bit line BL-i equals $V_{BL1}$, $V_{BL2}$, $V_{BL3}$, or $V_{BL4}$, respectively.

The sense amplifiers SA-1, SA-2, and SA-3, to which the voltage on the bit line BL-y is fed by way of the data line DL, output a high level ("1") when its input is higher than its threshold voltage and output a low level ("0") when its input is lower than its threshold voltage. The threshold voltages $V_1$, $V_2$, and $V_3$ of the sense amplifiers SA-1, SA-2, and SA-3 are determined such that $V_{BL1}<V_1<V_{BL2}<V_2<V_{BL3}<V_3<V_{BL4}$.

Figure 4:
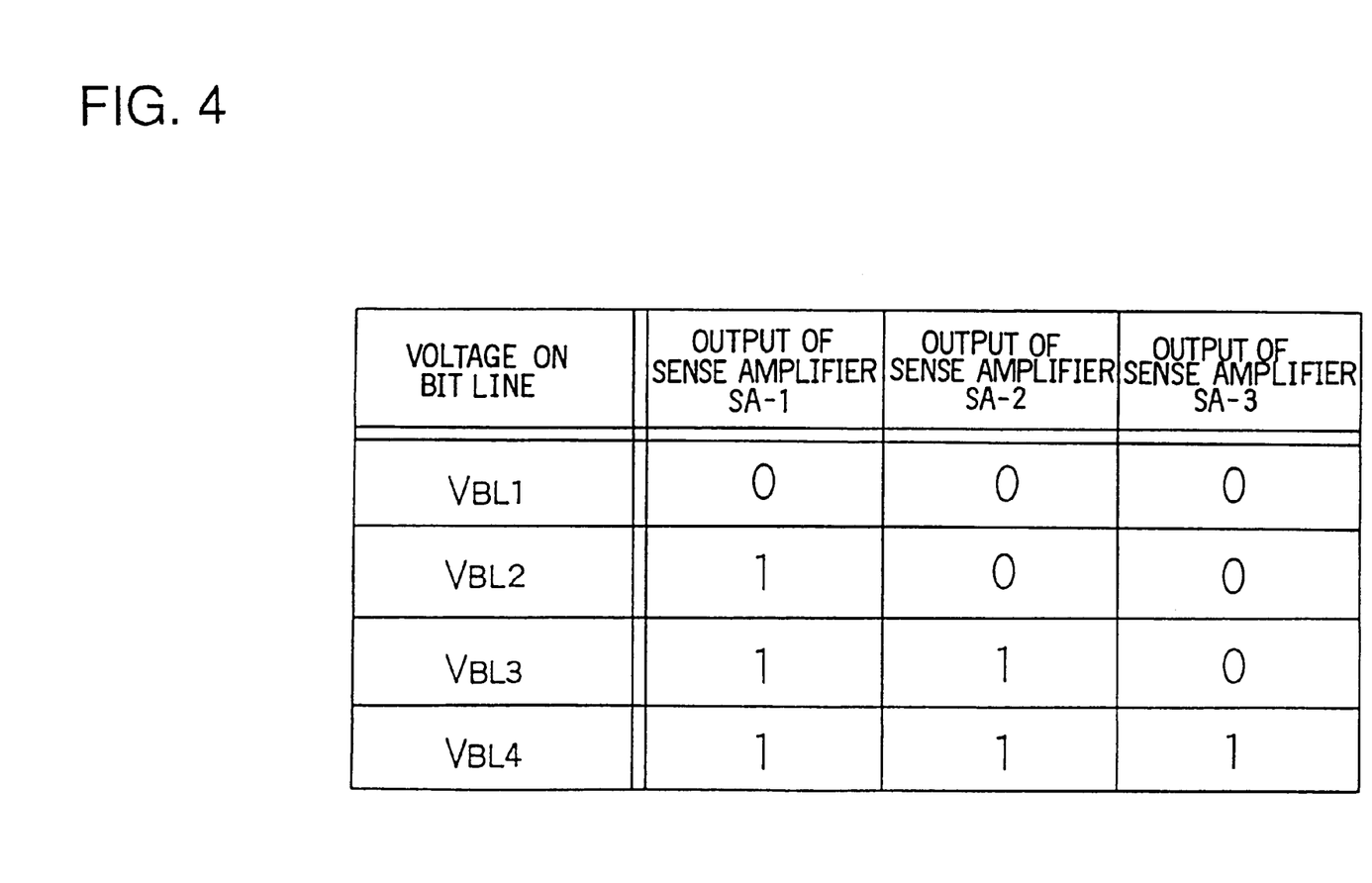
FIG. 4 is a diagram illustrating the relation between the voltage on the bit line and the outputs of the sense amplifiers.

Thus, the sense amplifiers SA-1, SA-2, and SA-3 convert the voltage appearing on the bit line BL-i into three-bit data, i.e. performs analog-to-digital conversion on that voltage, in such a way that, when the voltage on the bit line equals $V_{BL1}$, $V_{BL2}$, $V_{BL3}$, or $V_{BL4}$, three-bit data "000", "100", "110", or "111" is outputted, as shown in FIG. 4. In this way, the voltage on the bit line BL-i is detected. The three-bit value "000", "100", "110", or "111" outputted from the semiconductor memory 1 represents a two-bit value "11", "01", "10", or "00", respectively, stored therein.

In short, in the semiconductor memory 1 of the embodiment under discussion, two bits of data is stored in each memory cell transistor in accordance with the amount of electric charge (i.e. the threshold voltage of the memory cell transistor) accumulated in its floating gate, and the data stored in the memory cell transistor selected by the row and column decoders is read out as three-bit data. The reading of data is performed in one step.

Although the embodiment described above deals only with the case where data is stored on a two-bits-per-cell basis, the present invention is applicable not only to similar cases, but also to cases where more than two bits are stored in one memory cell.

According to the present invention, even in cases where two or more bits are stored in one memory cell, a read operation can be performed in one step. This helps reduce the access time required and the power consumed when data is read out. Moreover, in read-only memories, it is no longer necessary to apply a voltage to the control gate of the memory cell transistor and switch the voltage among a plurality of choices as is customary in conventional semiconductor memories when data is read out. This helps reduce the circuit area and cost.

Moreover, in a semiconductor memory according to the present invention, the drain and gate of the memory cell transistor are kept at an equal potential when data is read out. This helps eliminate drain disturbance. In addition, by setting the current supplied from the constant-current circuit CC at a low rate, it is possible to reduce also read disturbance. With no drain disturbance and reduced read disturbance, the change in the mount of electric charge accumulated in the floating gate is suppressed, and this greatly increases the data storage accuracy of the semiconductor memory. In particular, in multivalued memory cells where the differences between the threshold voltages of the transistor is small, the data storage accuracy is improved effectively. When the present invention is applied, for the purpose of preventing drain disturbance, to a semiconductor memory that stores data on a one-bit-per-cell basis, the amount of electric charge accumulated in the floating gate of the memory cell transistor is controlled to be in one of two ranges, and only one sense amplifier is used.

Obviously, many modifications and variations of the present invention are possible in light of the above teachings. It is therefore to be understood that within the scope of the appended claims, the invention may be practiced other than as specifically described.

What is claimed is:

1. A semiconductor memory in which each memory cell is composed of a transistor having a floating gate between a control gate and a conducting channel formed between a drain and a source and in which storage of data is achieved on the principle that the threshold voltage of said transistor varies with the amount of electric charge accumulated in said floating gate, wherein, while a transistor constituting a memory cell from which data is read out is supplied with a predetermined current, the control gate and the drain of that transistor are kept short-circuited.

2. A semiconductor memory as claimed in claim 1, wherein said semiconductor memory further has a means for detecting a voltage that appears on a bit line to which said transistor supplied with the predetermined current is connected.

3. A semiconductor memory as claimed in claim 1, wherein said transistor has a four-step threshold voltage so that two bits of data can be stored in each memory cell.

4. A semiconductor memory comprising:

a plurality of transistors arranged in a matrix consisting of a predetermined number of rows and a predetermined number of columns, each transistor having a drain, a source, a gate, and a floating gate;

a common line;

first lines provided one for each row of transistors and connected to gates of all transistors within each row;

second lines provided one for each column of transistors and connected to drains of all transistors within each column;

first switching devices provided one for each row of transistors and connected, at one end, to said common line and, at the other end, to a corresponding one of said first lines;

second switching devices provided one for each column of transistors and connected, at one end, to said common line and, at the other end, to a corresponding one of said second lines;

a third switching device connected, at one end, to sources of all transistors and, at the other end, to a predetermined potential;

a constant-current source for supplying a constant current to said common line; and a detecting circuit for detecting a potential on said common line.

5. A semiconductor memory as claimed in claim 4, wherein each transistor stores one of two values by accumulating, in its floating gate, electric charge in one of two ranges of amounts.

6. A semiconductor memory as claimed in claim 5,
wherein said detecting circuit compares the potential on said common line with one reference value and outputs a one-bit value as a comparison result.

7. A semiconductor memory as claimed in claim 4,
wherein each transistor stores one of four values by accumulating, in its floating gate, electric charge in one of four ranges of amounts.

8. A semiconductor memory as claimed in claim 7,
wherein said detecting circuit compares the potential on said common line with three different reference values and outputs three one-bit values as comparison results.

9. A semiconductor memory as claimed in claim 4,
wherein the predetermined potential to which said third switching device is connected at the other end is a ground potential.

* * * * *